United States Patent
Muthur Srinath et al.

(10) Patent No.: US 10,607,909 B2
(45) Date of Patent: Mar. 31, 2020

(54) SYSTEMS, METHODS, AND APPARATUSES FOR IMPLEMENTING A THERMAL SOLUTION FOR 3D PACKAGING

(71) Applicant: Intel Corporation, Santa Clara, CA (US)

(72) Inventors: Purushotham Kaushik Muthur Srinath, Chandler, AZ (US); Pramod Malatkar, Chandler, AZ (US); Sairam Agraharam, Chandler, AZ (US); Chandra M. Jha, Tempe, AZ (US); Arnab Choudhury, Chandler, AZ (US); Nachiket R. Raravikar, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/075,120

(22) PCT Filed: Apr. 2, 2016

(86) PCT No.: PCT/US2016/025779
§ 371 (c)(1),
(2) Date: Aug. 2, 2018

(87) PCT Pub. No.: WO2017/171889
PCT Pub. Date: Oct. 5, 2017

(65) Prior Publication Data
US 2019/0043772 A1    Feb. 7, 2019

(51) Int. Cl.
*H01L 23/367* (2006.01)
*H01L 23/26* (2006.01)
(Continued)

(52) U.S. Cl.
CPC ............ *H01L 23/26* (2013.01); *H01L 23/36* (2013.01); *H01L 23/4334* (2013.01);
(Continued)

(58) Field of Classification Search
CPC .................. H01L 25/0657; H01L 27/11578
See application file for complete search history.

(56) References Cited

U.S. PATENT DOCUMENTS 6,707,140 B1 * 3/2004 Nguyen ............ H01L 23/49838
257/686
2003/0035269 A1   2/2003 Chiu
(Continued)

OTHER PUBLICATIONS

International Preliminary Report on Patentability for International Patent Application No. PCT/US2016/025779, dated Oct. 11, 2018, 12 pages.
(Continued)

*Primary Examiner* — George R Fourson, III
(74) *Attorney, Agent, or Firm* — Schwabe, Williamson & Wyatt, P.C.

(57) ABSTRACT

In accordance with disclosed embodiments, there are provided methods, systems, and apparatuses for implementing a thermal solution for 3D packaging. For instance, in accordance with one embodiment, there is an apparatus having therein: a substrate layer having electrical traces therein; a first layer functional silicon die electrically interfaced to the electrical traces of the substrate layer, the first layer functional silicon die having a first thermal pad integrated thereupon; a second layer functional silicon die positioned above the first layer functional silicon die, the second layer functional silicon die having a second thermal pad integrated thereupon; and a conductivity layer positioned between the first layer functional silicon die and the second layer functional silicon die, wherein the conductivity layer is to: (i) electrically join the second layer functional silicon die to the first layer functional silicon die and (ii) bond the first thermal pad of the first layer functional silicon die to the second thermal pad of the second layer functional silicon die via solder. Other related embodiments are disclosed.

25 Claims, 9 Drawing Sheets

(51) Int. Cl.
*H01L 23/433* (2006.01)
*H01L 25/065* (2006.01)
*H01L 23/36* (2006.01)
*H01L 23/00* (2006.01)
*H01L 25/18* (2006.01)
*H01L 23/31* (2006.01)

(52) U.S. Cl.
CPC .......... *H01L 24/00* (2013.01); *H01L 25/0657* (2013.01); *H01L 25/18* (2013.01); *H01L 23/3121* (2013.01); *H01L 2225/06513* (2013.01); *H01L 2225/06548* (2013.01); *H01L 2225/06575* (2013.01); *H01L 2225/06589* (2013.01); *H01L 2924/157* (2013.01)

(56) References Cited

U.S. PATENT DOCUMENTS

| | | | |
|---|---|---|---|
| 2009/0251862 A1 | 10/2009 | Knickerbocker et al. | |
| 2012/0049354 A1* | 3/2012 | Sawayama | H01L 21/561 257/737 |
| 2012/0199981 A1* | 8/2012 | Jeong | H01L 23/481 257/774 |
| 2013/0181354 A1 | 7/2013 | Khan et al. | |
| 2014/0077391 A1* | 3/2014 | Kikuchi | H01L 23/49827 257/774 |
| 2015/0069635 A1* | 3/2015 | Kim | H01L 24/19 257/777 |
| 2015/0214207 A1* | 7/2015 | Yoshida | H01L 25/18 438/109 |
| 2015/0236002 A1* | 8/2015 | Haba | H01L 25/18 257/713 |
| 2015/0279431 A1* | 10/2015 | Li | H01L 25/50 365/51 |
| 2016/0329304 A1* | 11/2016 | Hatakeyama | H01L 24/97 |

OTHER PUBLICATIONS

International Search Report and Written Opinion for International Patent Application No. PCT/US2016/025779 dated Dec. 29, 2016, 17 pgs.

* cited by examiner

SYSTEMS, METHODS, AND APPARATUSES FOR IMPLEMENTING A THERMAL SOLUTION FOR 3D PACKAGING

CROSS-REFERENCE TO RELATED APPLICATION

This patent application is a U.S. National Phase Application under 35 U.S.C. § 371 of International Application No. PCT/US2016/025779, filed Apr. 2, 2016, entitled "SYSTEMS, METHODS, AND APPARATUSES FOR IMPLEMENTING A THERMAL SOLUTION FOR 3D PACKAGING," which designates the United States of America, the entire disclosure of which is hereby incorporated by reference in its entirety and for all purposes.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to systems, methods, and apparatuses for implementing a thermal solution for 3D packaging.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

Today's consumer electronics market frequently demands complex functions requiring very intricate circuitry. Scaling to smaller and smaller fundamental building blocks, (e.g. transistors), has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support increased circuit density. Furthermore, the demand for higher performance devices results semiconductor and substrate packages which generate significant amounts of heat due to the package density and the high power devices integrated within such packages.

A key challenge with the manufacture of three-dimensional (3D) integrated circuit (IC) semiconductor packaging is to provide a design with sufficient heat dissipation properties from logic devices or other functional silicon devices embedded within the 3D package which generate heat and create hot spots internal to the 3D substrate package. The problem is especially problematic with 3D or stacked substrate packages because unlike conventional package substrates where such functional silicon dies are exposed at a top surface and may therefore be interfaced directly to a heat sink to collect and dissipate the heat, 3D or stacked packages may have one or more heat generating functional silicon dies buried or covered by one or more other silicon die due to the stacked silicon die formation.

Conventional solutions utilize a polymer dissipation means of heat dissipation for 3D packages or stacked die combinations. Heat is generated by, for instance, a logic device buried within the 3D package and prior solutions are not sufficiently effective at extracting the heat generated from the interior of the 3D package and transferring the heat to the surface where it may then be dissipated via for instance, an external heat sink.

The present state of the art may therefore benefit from the thermal solution for 3D packaging as is described herein.

BRIEF DESCRIPTION OF THE DRAWINGS

Embodiments are illustrated by way of example, and not by way of limitation, and will be more fully understood with reference to the following detailed description when considered in connection with the figures in which.

DETAILED DESCRIPTION

Figure 1A:
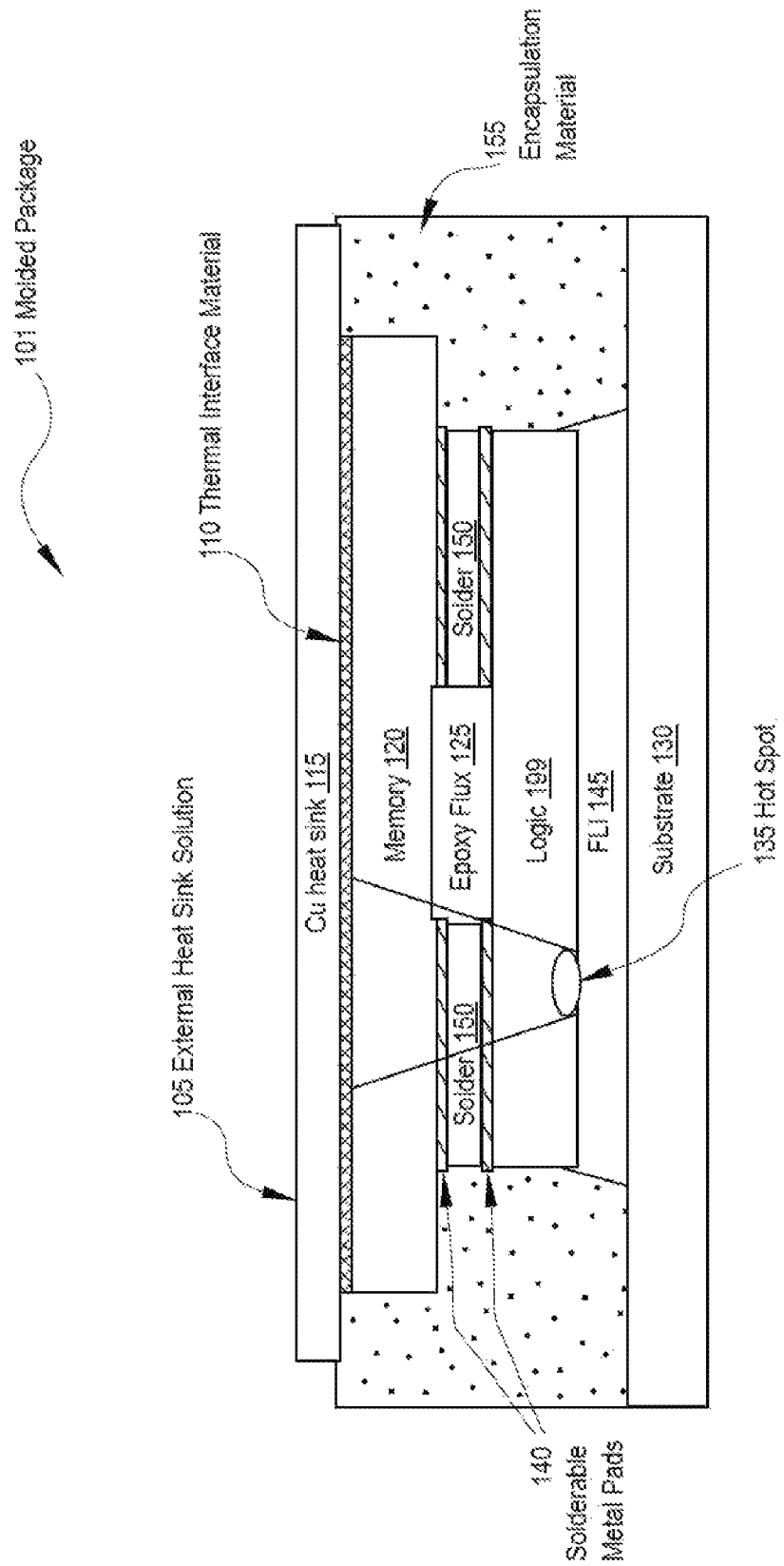
FIG. 1A depicts a 3D substrate molded package in accordance with described embodiments.

Described herein are systems, apparatuses, and methods for implementing a thermal solution for 3D packaging in accordance with described embodiments. For instance, in accordance with one embodiment, there is an apparatus having therein: a substrate layer having electrical traces therein; a first layer functional silicon die electrically interfaced to the electrical traces of the substrate layer, the first layer functional silicon die having a first thermal pad integrated thereupon; a second layer functional silicon die positioned above the first layer functional silicon die, the second layer functional silicon die having a second thermal pad integrated thereupon; and a conductivity layer positioned between the first layer functional silicon die and the second layer functional silicon die, wherein the conductivity layer is to: (i) electrically join the second layer functional silicon die to the first layer functional silicon die and (ii) bond the first thermal pad of the first layer functional silicon die to the second thermal pad of the second layer functional silicon die via solder.

Described embodiments provide means by which to integrate a high power device buried within in a stacked die configuration with an improved means to provide a thermal solution to dissipate the heat generated by the high powered device buried in the stack without the need for new and exotic underfill material development. Additionally, as the underfills and Epoxy flux can be fine tuned independent of the thermal requirements, ease of manufacturability, yield and reliability may be further improved. Such solutions may therefore be utilized in all 3D package integration processes for high power devices including those targeted for use in High Performance Computing (HPC), high performance cores, Graphics, High Bandwidth Memory, etc.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

FIG. 1A depicts a 3D substrate molded package 101 in accordance with described embodiments. In particular, there is depicted a substrate 130 at a bottom most layer and a copper (Cu) heat sink 115 at a topmost layer which then interfaces to an external heat sink solution 105 to be added after manufacture of the molded package 101. According to a particular embodiment, the 3D packaging is achieved with the use of through-mold first level interconnects (FLI) as represented by the FLI 145 layer above the substrate 130.

According to described embodiments, improved thermal dissipation of heat generated by a high power device buried within a stacked die package architecture is provided.

Embodiments described herein may include, for example, 3D stacked die, face-to-face 3D stacking, through-mold FLI, and 3D stacked die on a central processing unit (CPU). In certain embodiments, two or more die are stacked without the use of through silicon vias (TSVs) or wire-bonds in which a TSV approach is a through approach, whereas a wirebond approach is a bypass approach. One or more embodiments described herein may be characterized as a hybrid through and by-pass approach. In an embodiment, one or more smaller dies are packaged via face-to-face (FtF) stacking with a larger die.

Further depicted is logic 199 which generates heat within the molded package 101 and thus generates hot spot 135. Solderable metal pads 140 are bonded via solder 150 complemented by the epoxy flux 125. Memory 120 device sits atop the solderable metal pads 140 and interfaces to the thermal interface material 110 and then to the Cu heat sink 115 as shown. The molded package 101 is then encapsulated via encapsulation material 155.

According to a particular embodiment, a top die is larger than a bottom die and the top die includes tall copper bumps surrounding the bottom die to provide first level interconnection (FLI) to a package substrate. In such an embodiment, the FLI bumps may be embedded inside a molding compound for ease of assembly process and structural protection.

Heat developed locally by the logic device 199 results in the hot spot which must be efficiently transferred to the surface for heat dissipation via the external heat sink solution if the device is to remain functionally viable for its design life.

Conventional solutions which rely upon exotic high thermally conducting backfill and molding compounds introduce a variety of problems with the fill materials themselves, however, beyond the problems associated with such fill materials, it has been observed that heat generated from the local logic device 199 still is not sufficiently dissipated and is retained vertically within the 3D package which results in the buildup of heat and eventually the hotspot 135 as depicted.

Certain epoxy flux compounds are effective at dissipating heat and may be utilized with the described embodiments, however, they alone are not sufficient as the epoxy flux compounds or other encapsulation materials draw heat from the outermost regions of the 3D package but lack sufficient proximity to the vertically retained heat in the core of such 3D packages to effectively draw out and dissipate such heat.

Described embodiments may also wholly eliminate the use of such epoxy flux compounds which are relied upon by conventional solutions for their high thermal conductivity as the solutions described herein provide for efficient heat dissipation from not only the outer regions of the 3D package but from also the interior core of such 3D packages, thus dissipating heat from the generated hotspot 135 which would otherwise be retained within the 3D package and potentially damaging or reducing the effective functional life of the 3D package.

Figure 1B:
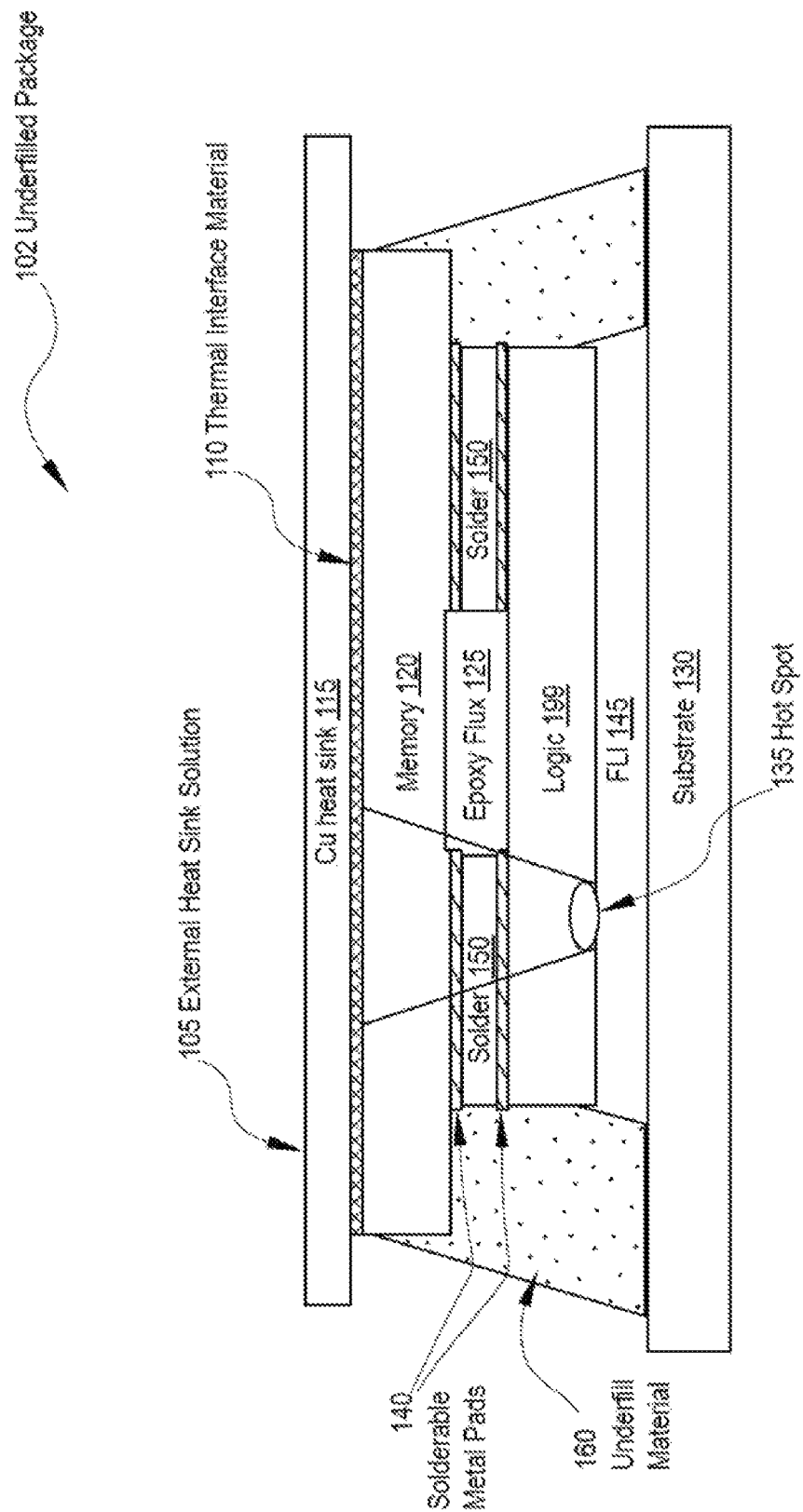
FIG. 1B depicts a 3D substrate underfilled package with backfill or underfill material.

FIG. 1B depicts a 3D substrate underfilled package 102 with backfill or underfill material 160 rather than the molded compound encapsulation material 155 of the molded package 101 depicted at FIG. 1A. Further depicted by FIG. 1B are the substrate 130 at a bottom most layer and a copper (Cu) heat sink 115 at a topmost layer which then interfaces to an external heat sink solution 105 to be added after manufacture of the underfilled package 102. First level interconnects (FLI) 145 layer above the substrate 130 is depicted and further depicted is logic 199 which generates heat within the underfilled package 102 and thus generates hot spot 135. Solderable metal pads 140 are bonded via solder 150 complemented by the epoxy flux 125. Memory 120 device sits atop the solderable metal pads 140 and interfaces to the thermal interface material 110 and then to the Cu heat sink 115 as shown. The underfilled package 102 is then backfilled or underfilled via underfill material 160, thus forming the underfilled package 102.

According to certain embodiments, the encapsulation material 155 in a molded package 101 as well as underfill material 160 in an underfilled package 102 is selected based on its material properties, and in particular, selected to provide high thermal conductivity. Such encapsulation material 155 and underfill material 160 sometimes requires the development of new materials that meet multiple other design and engineering requirements, such as ease of manufacturability, yield, reliability and cost.

High thermal conductivity is typically achieved by incorporating highly loaded filler which is thermally conductive. However, such an approach increases the complexity of manufacturing and creates problems such as dispensability of the encapsulation material 155 and underfill material 160, problems with assembly or bonding die packages with high viscosity attributable to the encapsulation material 155 and underfill material 160 loaded with such fillers, reduced yields, and most problematically, reduced reliability of the resulting semiconductor package due to higher filler entrapment due to high filler loading. Moreover, such new materials require investment and can represent significant material development costs to the manufacturer.

It may therefore be preferable to utilize existing encapsulation material 155 and underfill material 160 for the manufacture of such 3D packages despite such materials exhibiting lower thermal conductivity.

According to the described embodiments, the thermal solutions for 3D packaging as described herein permit the use of existing encapsulation material 155 and underfill material 160 for the manufacture of such 3D packages by introducing targeted and specialized heat dissipation means within such packages.

In accordance with a particular embodiment, in place of relying solely upon a highly thermally conductive underfill material 160 to underfill the entire shadow of the topmost functional silicon die, memory 120, as is done in the conventional arts, the described embodiments additionally or alternatively utilize a thermally conducting solderable metal pad 140 which covers the entire logic die 199 back plate along with solder 150 to connect the bottom most logic die 199 with the topmost functional silicon die, the memory 120. In such a way, the bottom logic die 199 is both electrically and thermally interfaced to the topmost memory 120 forming a continuous path for heat dissipation from the logic device 199 through the solderable metal pad 140 through the solder 150, and into the top memory 120, from which heat may then be dissipated at the surface of the 3D underfilled package 120 via conventional means, such as the copper heat sink 115 or the external heat sink solution 105, or both.

Because the 3D package is still underfilled with underfill material 160, the described embodiment may be utilized with non-thermally conductive underfill material or with highly thermally conductive underfill material as the vertically retained heat emanating from hotspot 135 will be dissipated through the solderable metal pad(s) 140 and solder 150 as described above.

In another embodiment, both the logic 199 device buried within the 3D package is plated with a solderable metal pad 140 and also the upper memory 120 functional silicon device is plated with a solderable metal pad 140 and the two solderable metal pads are electrically and thermally interfaced via the solder 150 as depicted at each of FIGS. 1A and 1B.

According to the described embodiments, copper or nickel solderable metal pads are utilized between the upper and lower functional silicon dies (e.g., the memory 120 and the logic 199 respectively) providing a continuous path for thermal dissipation through the metallic stackup to dissipate heat that would otherwise be vertically retained within the 3D package.

According to such embodiments, the copper or nickel pads possess material properties which far exceed any known polymer based underfill material 160 or molded compound encapsulation material 155, such as an epoxy flux. For instance, the best performing polymers available today may conduct heat at two or three watts per meter Kelvin, whereas heat conducts through the solderable metal pads and the solder at a rate closer to 20 watts per meter Kelvin.

The silicon of the functional silicon dies including the logic and memory are also very good conductors of heat, but once the heat reaches any epoxy material the thermal conductivity drops off significantly and a hotspot develops as the heat is unable to continue transferring to point of dissipation such as through the upper most functional silicon die and into a heat sink at the surface of the 3D package.

Use of the continuous metallic to silicon structures therefore provides an excellent path for continuous heat conductivity and dissipation at a much higher rate than that which is feasible through any epoxy.

Because air is a poor conductor of heat, the solder 150 and epoxy flux 125 in the core of the 3D molded package 101 and 3D underfilled package 102 is utilized as a medium for heat transfer from the bottom logic 199 to the upper memory 120 and then out the heat sink at the surface. Otherwise, any air gap between the bottom logic 199 to the upper memory 120 would reduce the effective heat dissipation of the 3D package, thus permitting the hotspot 135 at the core of the 3D package to increase in heat intensity. Polymer's with heat conducting fillers which are common underfill and mold compound materials could be utilized but would be less effective for the sake of thermal dissipation and would likely increase manufacturing complexity and costs whereas use of solder between two solderable metal pads 140 plated to the respective dies provides for a continuous metallic interface heat transference mechanism without the risk of any air gap and without the need to rely upon exotic and problematic highly thermally conductive polymers.

As is depicted at FIGS. 1A and 1B there does remain a portion of epoxy flux 125 in the center core of the 3D package, however, a sufficiently large copper and solder metallic service area is provided via the solderable metal pads and solder that heat readily dissipates from the hotspot 135 and up through the solder and the pads, through the silicon memory, and ultimately out the copper heat sink 115 or whatever external heat sink solution 105 may be utilized. The epoxy flux 125 in the center core of the 3D package provides a bump field and interconnectivity for each of the respective dies. For instance, via the bump field within the epoxy flux there may be electrical interconnects or electrical joins between the memory 120 and the logic 199.

Figure 2A:
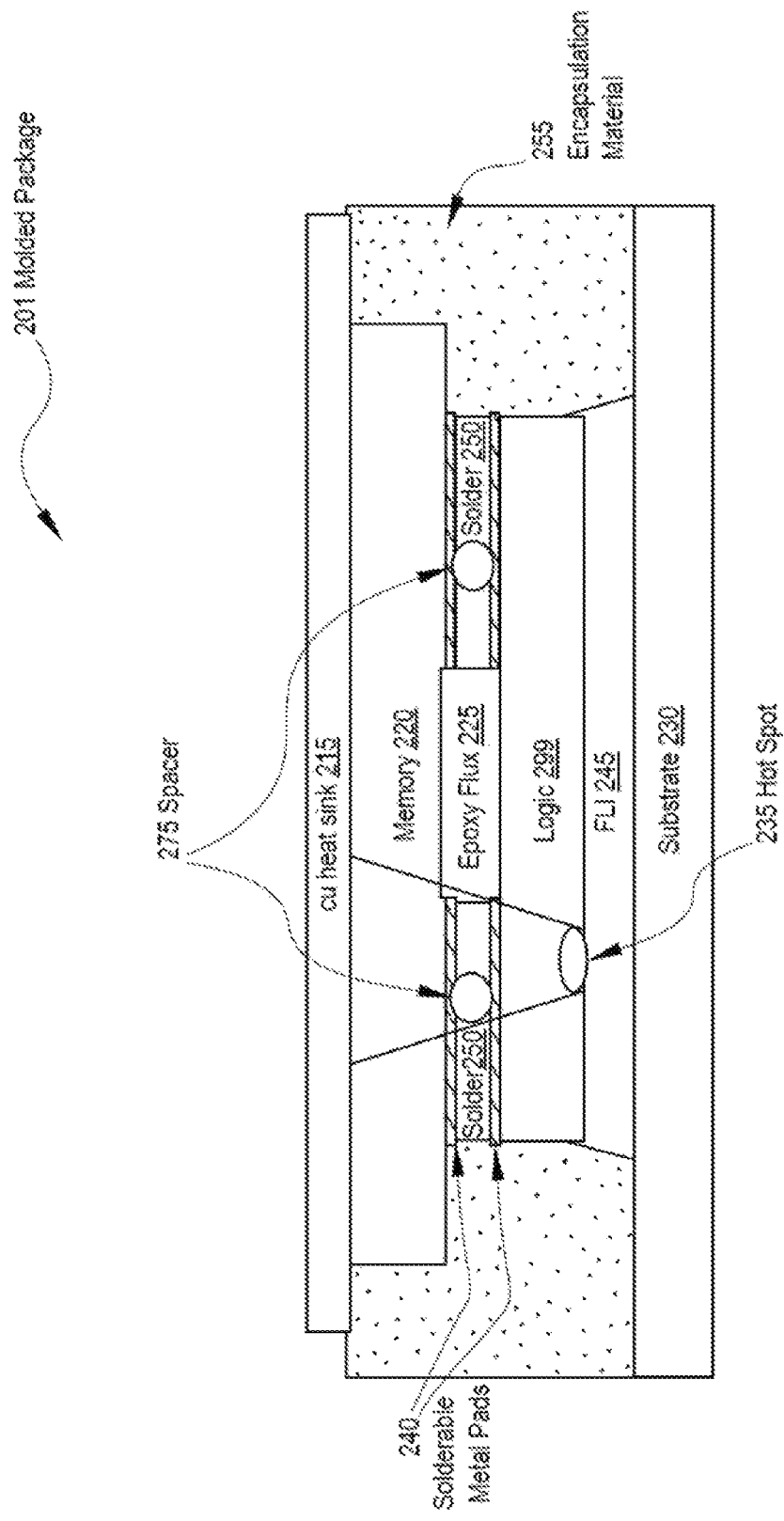
FIG. 2A depicts a 3D substrate molded package in accordance with described embodiments.

FIG. 2A depicts a 3D substrate molded package 201 in accordance with described embodiments. In particular, there is depicted a substrate 230 at a bottom most layer and a copper (Cu) heat sink 215 at a topmost layer. First level interconnects (FLI) 245 layer above the substrate 230 is depicted and further depicted is logic 299 which generates heat within the molded package 201 and thus generates hot spot 235.

Notably, the topmost functional silicon die, memory 220, completely overhangs the lower most functional silicon die, logic 299.

Solderable metal pads 240 are bonded via solder 250 complemented by the epoxy flux 225. A spacer 275 is positioned or sandwiched between the solderable metal pads on both the left and the right sides of the diagram of the molded package 201. Memory 220 device sits atop the solderable metal pads 240 and interfaces to the Cu heat sink 215 as shown. Encapsulation material 255 is added thus forming the molded package 201.

A potential problem with the use of the solder 250 between the solderable metal pads 240 within the core of the 3D packages is the risk of non-aligned, mis-aligned, or non-planer manufacturing defects. For instance, if the solder 250 spreads unevenly at the right and left sides or is dispensed in unequal amounts on the right and left sides, then it is possible for the upper layers including the upper solderable metal pad 240 and the memory 220 to be bonded inconsistently between manufactured units and exhibit various defects, such as the top surface exhibiting an angle or slope, or the top layers being misaligned laterally left or right or forward or backward, and so forth.

The spacers 275 are therefore introduced in accordance with the depicted embodiment, which may be utilized to ensure a more precise fitment and bonding of the upper layers (e.g., memory and upper solderable metal pad) to the bottom layers (e.g., the logic and the lower solderable metal pad). For instance, some pressure may be applied to the 3D package at the bonding process without risking over compression of the solder as the spacers will bring the upper layers and lower layers in to a precision design height which will then be fixed in place after the bonding.

The spacers 275 may therefore be utilized to pre-define and also control the height for the chip depth and spacing within the 3D package. Without the spacer 275, certain structures may be difficult to consistently control the chip depth and spacing between them, potentially resulting in inconsistent chip gap and thus varying degrees of thermal effectiveness which is moderated as a function of the height of the solder.

According to a particular embodiment, the height of the solder is tuned for maximum thermal dissipation until an optimal chip gap height is attained and the spacer 275 is then calibrated to that optimal chip gap height so as to ensure consistent manufacturing results of the chip gap height and solder depth. Stated differently, the spacer diameter or height may be selected on the basis of the determined optimal solder height between the two functional silicon die surfaces. Use of the spacer 275 may therefore enable more predictable performance through a more consistent unit to unit physical architecture, especially in terms of chip gap height and solder thickness.

Figure 2B:
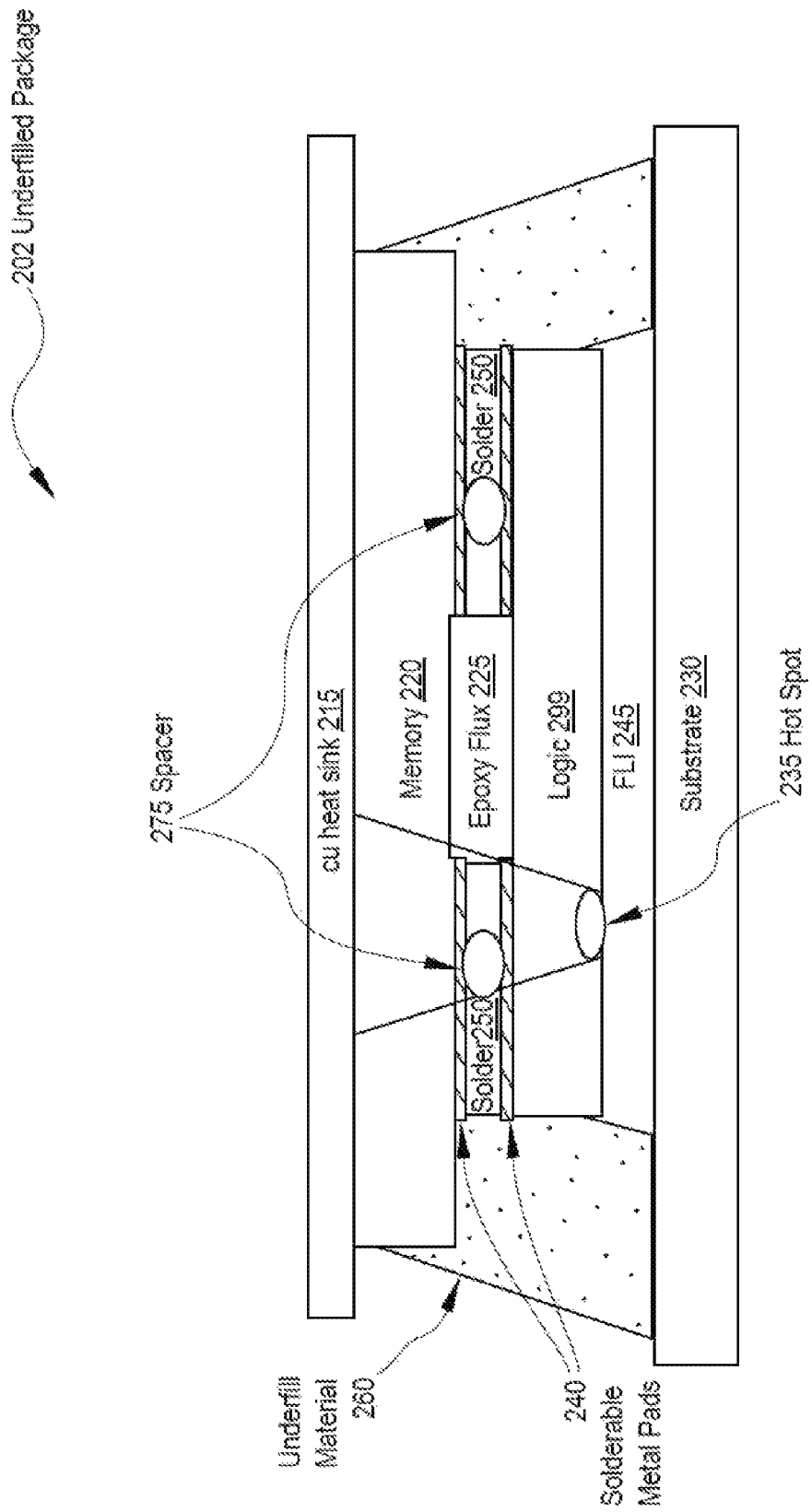
FIG. 2B depicts an underfilled package as an alternative to the molded package.

FIG. 2B depicts an underfilled package 202 as an alternative to the molded package 201 of FIG. 2A.

In particular, FIG. 2B depicts a 3D substrate underfilled package 202 in accordance with described embodiments. In particular, there is depicted a substrate 230 at a bottom most layer and a copper (Cu) heat sink 215 at a topmost layer. First level interconnects (FLI) 245 layer above the substrate 230 is depicted and further depicted is logic 299 which generates heat within the underfilled package 202 and thus generates hot spot 235.

As was the case with the molded package 201 depicted at FIG. 2A, the topmost functional silicon die, memory 220 of the underfilled package 202 at FIG. 2B also completely overhangs the lower most functional silicon die, logic 299.

Solderable metal pads 240 are bonded via solder 250 complemented by the epoxy flux 225. A spacer 275 is positioned or sandwiched between the solderable metal pads on both the left and the right sides of the diagram of the molded package 201. Memory 220 device sits atop the solderable metal pads 240 and interfaces to the Cu heat sink 215 as shown. Underfill material 260 is added thus forming the underfilled package 202.

In this configuration as depicted, the foot print of the top die, memory 220, being stacked, completely encompasses the footprint of the bottom die, logic 299, and therefore, the large solderable metal pads 250 are incorporated on backside of the bottom die covering the depicted hot spot 235 locations and solderable metal pads 250 are also added to the front side of the top die, memory 220, so as to provide a continuous path from the bottom most functional silicon die of the die stack through the solderable metal pads, through the solder, through the top most functional silicon die and its solderable metal pads, and ultimately to the surface where heat may be dissipated from the stacked 3D die package.

According to a particular embodiment, the solderable metal pads 250 of each of the respective upper and lower functional silicon dies are then attached to one another using thermally conductive metal alloys (solder 250) to provide a thermally conductive path for heat transfer from the hotspot(s) 235 generated by the bottom die, logic 299, through the bottom solderable metal pad 240 into the solder 250, to the top solderable metal pad 250 and into the top die, memory 220.

Different types of functional silicon dies may be utilized within the stack and there may be more layers than what are depicted here. Moreover, described embodiments are applicable to a variety of 3D packages including any of Wide Input/Output (WIO) DRAM 3D packages, WIO DRAM 2 3D packages, Hybrid Memory Cube (HMC) 3D packages, High Bandwidth Memory (HBM) 3D packages, Package-on-Package (PoP) 3D packages, stacked die 3D packages, etc.

As is further depicted, a spacer 275 such as a polymer core spacer is placed within the solder 250 to more precisely control the chip gap height between the top and bottom dies, specifically, the spacing between the top memory 220 and the bottom logic 299 functional silicon dies as depicted here.

The electrical interconnect area may be underfilled with underfill material 260 via either film or a dispensed underfill material 260 which provides for ease of manufacturability, high yield and reliability. Such underfill materials are well known and through the configuration described here the use encapsulation materials 255 for molded packages 201 and underfill materials 260 for underfilled packages 201 which lack the high thermal conductivity properties may nevertheless be utilized as a continuous path for thermal dissipation is provided from the buried lower functional die, logic 299, which generates heat resulting in hotspot 235 up through the top most functional silicon die, memory 220, which may then be dissipated through Cu heat sink 215 at the surface of the 3D package.

The encapsulation materials 255 and underfill materials 260 additionally isolates and protects the solder on the thermal pad and the electrical interconnects.

Figure 3:
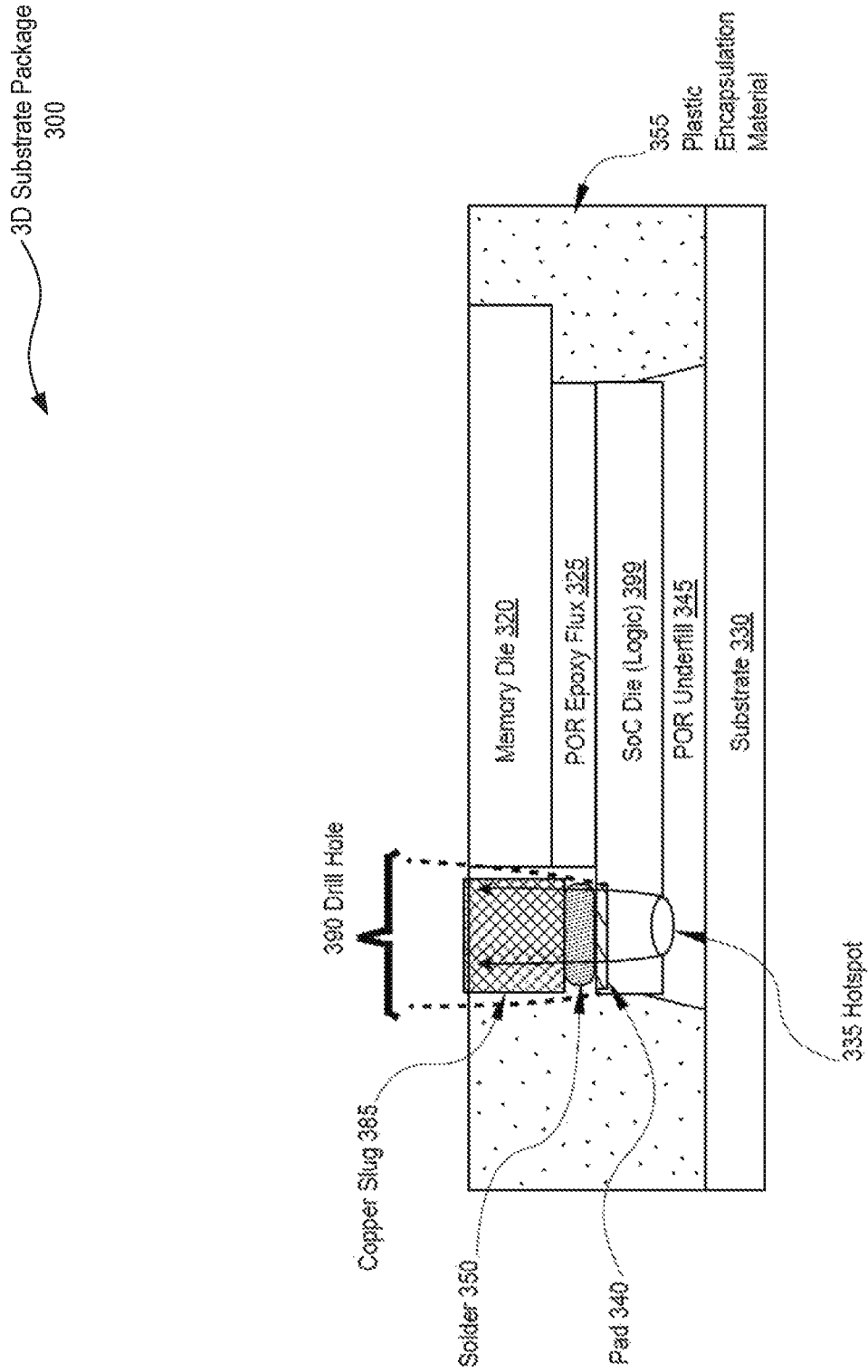
FIG. 3 depicts another 3D substrate package in accordance with described embodiments.

FIG. 3 depicts another 3D substrate package 300 in accordance with described embodiments. In particular, there is depicted a substrate 330 at a bottom most layer and a POR underfill 345 layer above, followed by the bottom most functional silicon die, a SoC (System on Chip) Logic Die 399 as depicted here. As can be seen, the SoC Logic Die 399 generates hotspot 335 deep within the 3D package. The POR epoxy flux 325 layer and the top most functional silicon die, memory die 320, are above the SoC logic die 399.

Unlike the molded package 201 depicted at FIG. 2A and the underfilled package 202 at FIG. 2B the top most functional silicon die, memory die 320, does not completely overhang the lower most functional silicon die, a SoC logic die 399. Rather, memory die 320 only partially overhangs the logic die 399 positioned or buried within the 3D package below.

As depicted, a solderable metal pad 340 is incorporated on the backside of the bottom die, SoC logic die 399, and a copper (Cu) slug 350 is soldered to the metal pad 340 via solder 350, so that the top of the Cu slug is coplanar with the backside of the top die, memory 320.

Plastic encapsulation material 355 is then molded around the functional silicon dies (SoC logic Die 399 and memory die 320) and the other layers, thus forming the molded 3D substrate package 300.

In an alternative embodiment, plastic encapsulation material 355 is molded around the functional silicon dies (SoC logic Die 399 and memory die 320) and the other layers, thus forming the molded 3D substrate package 300 but without the inclusion of the copper slug 385.

In accordance with a particular embodiment the entirety of the 3D substrate package is encased within a plastic encapsulation material 355 around the die stack and a hole or trench is drilled into the epoxy through the molded compound encapsulation material.

For instance, a hole may be drilled down through the epoxy encapsulating material directly over the location of where a known hotspot 335 forms during operation of the 3D substrate package, in which the drill hole 390 forms a void directly over where the hotspot 335 will develop during operation, emanating from the high power SoC logic die 399. Once drilled, a thermal pad 340 may be placed directly above the localized hotspot 335 on top of the SoC logic die 399. In an alternative embodiment, the SoC logic die 399 is fabricated during the wafer fabrication process with the thermal pad 340 integrated thereupon via copper filling. In another embodiment, the SoC logic die 399 is plated with the thermal pad 340 after wafer fabrication and before die stack assembly and then the thermal pad is encased within the die stack via the plastic encapsulating material 355, through which the hole is then drilled down to the thermal pad 340.

In certain embodiments, the thermal pad 340 when encased within the 3D package prior to drilling is made sufficiently thick such that a portion of the thermal pad 340 may be drilled away so as to create a clean metal to metal contact between the drilled thermal pad 340 and the solder 350 placed atop the thermal pad 340. The thickness of such a thermal pad is such that some of the thermal pad may be drilled away within a known tolerance for variation without damaging the underlying SoC logic die 399. For instance, under no circumstances should the drill head reach the SoC logic die 399 as the functional silicon wafer is likely to be damaged.

Regardless of which of the alternative methods are utilized, solder 350 is then added between the thermal pad 340 and a copper slug which is added on top of the copper to partially fill the void evacuated via the drill hole 399.

In another alternative embodiment, the solder 350 is pre-incorporated atop the thermal pad and encased within the plastic encapsulation material 355. In such an embodiment, the drill hole 355 is then drilled down to a depth of the solder 350 and the copper slug 385 is then added on top of the pre-incorporated solder 350.

In such a way, a localized thermal solution is introduced into the 3D substrate package where a lower layer buried functional silicon device is reachable by such a drill hole method. Once the SoC logic die 399 is metallically interfaced through the thermal pad 340 to the solder 350 and then to the surface of the 3D substrate package through the copper slug 385, thermal dissipation will be greatly improved. An external heat sink solution may further be utilized to provide still further improved heat dissipation at the top surface of the 3D substrate package.

The 3D substrate package may then be re-molded and re-encased in plastic encapsulation material or simply left exposed at the location of the copper slug 385 depending on design parameters.

According to another embodiment, a trench is drilled through the plastic encapsulation material 355 of the previously molded 3D substrate package 300 down into the 3D package until the SoC logic die 399 is reached, or until a pre-encased solderable metal pad 340 is reached, or until a pre-encased solder deposit is reached, thus forming a trench rather than a drill hole 390 within the previously modeled 3D substrate package 300.

With a void in the 3D substrate package formed by the trench, a thermal pad is then placed if not already present and the void is then partially filled with solder 350 via, for instance, either a paste, print, or dispense method, and then reflowed. With the inclusion then of the copper slug 385 there is a complete thermal dissipation path from the hot spot 335 generated at the buried SoC logic die 399 and up through the solderable metal pad 340 through the solder 350, into the copper slug 385, and to the surface of the molded 3D substrate package 300, regardless of whether the thermal pad and/or solder is added before or after molding.

In all described embodiments, regardless of whether the thermal pad and solder is introduced before or after molding, a thermal interface material and external heat sink may then be added and utilized at the surface of the molded 3D substrate package subsequent to the manufacture of the molded 3D substrate package 300 to dissipate heat generated from the buried SoC logic die 399 and formed at the hotspot 335.

Conventional solutions for thermal dissipation from stacked die packages require either the use of high thermal conductivity underfills, such as polymers densely packed with conductive fillers or by specially designed solder interconnects to operate as thermal bumps for heat transfer from the bottom die to top die, however, such a prior solution presents several issues as were noted above, including manufacturability issues including bonding, dispensability of the high thermal conductivity underfills, development costs, yield, and reliability problems.

Conversely, the described embodiments provide a less costly, more reliable, and less complex path for integration because existing underfill materials can be independently tuned for ease of manufacturability, high yields and product reliability, while still maintaining a highly efficient thermal solution via the integrated solderable metal pad 340, solder 350, and copper slug 385 as described.

According to a particular embodiment, the solderable metal pad 340 is incorporated onto the bottommost functional silicon die, such as the SoC logic die 399 as depicted here, at fabrication of the functional silicon die such that when the functional silicon die is integrated into the molded 3D substrate package 300, it is already present on the lower layer die to be buried within the package and therefore an assembly operation is eliminated.

According to a particular embodiment, a large continuous solderable metal pad 340 is incorporated onto both functional silicon dies (e.g., SoC logic Die 399 and memory die 320) via a solder 350 alloy to facilitate more efficient heat transfer between them which results in improved heat dissipation as compared to the use of several individual thermal bumps which have a smaller effective area for heat transfer.

Modern high power devices which generate large amounts of heat may be utilized in accordance with the described embodiments without the need for newly developed and exotic underfill materials due to the effective path of heat transference between the buried functional silicon die, SoC logic die 399 which creates the hotspot 335 deep within the 3D package and the top surface of the 3D package or the uppermost functional silicon die, memory die 320, of the 3D package through which heat may be dissipated via the aid of an external heat sink solution.

It is therefore in accordance with a particular embodiment that there is a three-dimensional (3D) semiconductor package including: a substrate layer having electrical traces therein; a first layer functional silicon die electrically interfaced to the electrical traces of the substrate layer; a second layer functional silicon die positioned above the first layer functional silicon die, the second layer functional silicon die partially covering a first portion of the first silicon functional die and in which a second portion of the first silicon functional die remains uncovered by the second layer functional silicon die; a conductivity layer positioned between the first layer functional silicon die and the second layer functional silicon die, in which the conductivity layer is to electrically join the second layer functional silicon die to the first layer functional silicon die; a thermal pad integrated upon a top surface of the first functional silicon die within the second portion of the first silicon functional die which remains uncovered by the second layer functional silicon die; encapsulation material fully encasing the first layer functional silicon die, the second layer functional silicon die, and the conductivity layer; a drill hole from which the a portion of the encapsulation material is evacuated from a surface of the 3D semiconductor package down to the thermal pad integrated upon the top surface of the first functional silicon die; and solder material partially filling the drill hole to bond a copper slug to the thermal pad within the drill hole.

According to another embodiment of the 3D semiconductor package, the first layer functional silicon die includes an electrically powered System On a Chip (SOC) logic device that generates heat during operation and creates a hotspot internal to the 3D semiconductor package.

According to another embodiment of the 3D semiconductor package, the copper slug within the drill hole provides a continuous thermally conductive metallic interface to dissipate the heat from the hotspot internal to the 3D semiconductor package from the SOC logic device into the thermal pad through the solder material and into the copper slug; and in which the copper slug reaches a top surface of the 3D semiconductor package from which the heat is dissipated from the 3D semiconductor package.

According to another embodiment of the 3D semiconductor package, an external heat sink is affixed to the topmost surface of the 3D semiconductor package; and in which the heat from the hotspot further dissipates from the copper slug reaching the topmost surface of the 3D semiconductor package and into the external heat sink.

Figure 4:
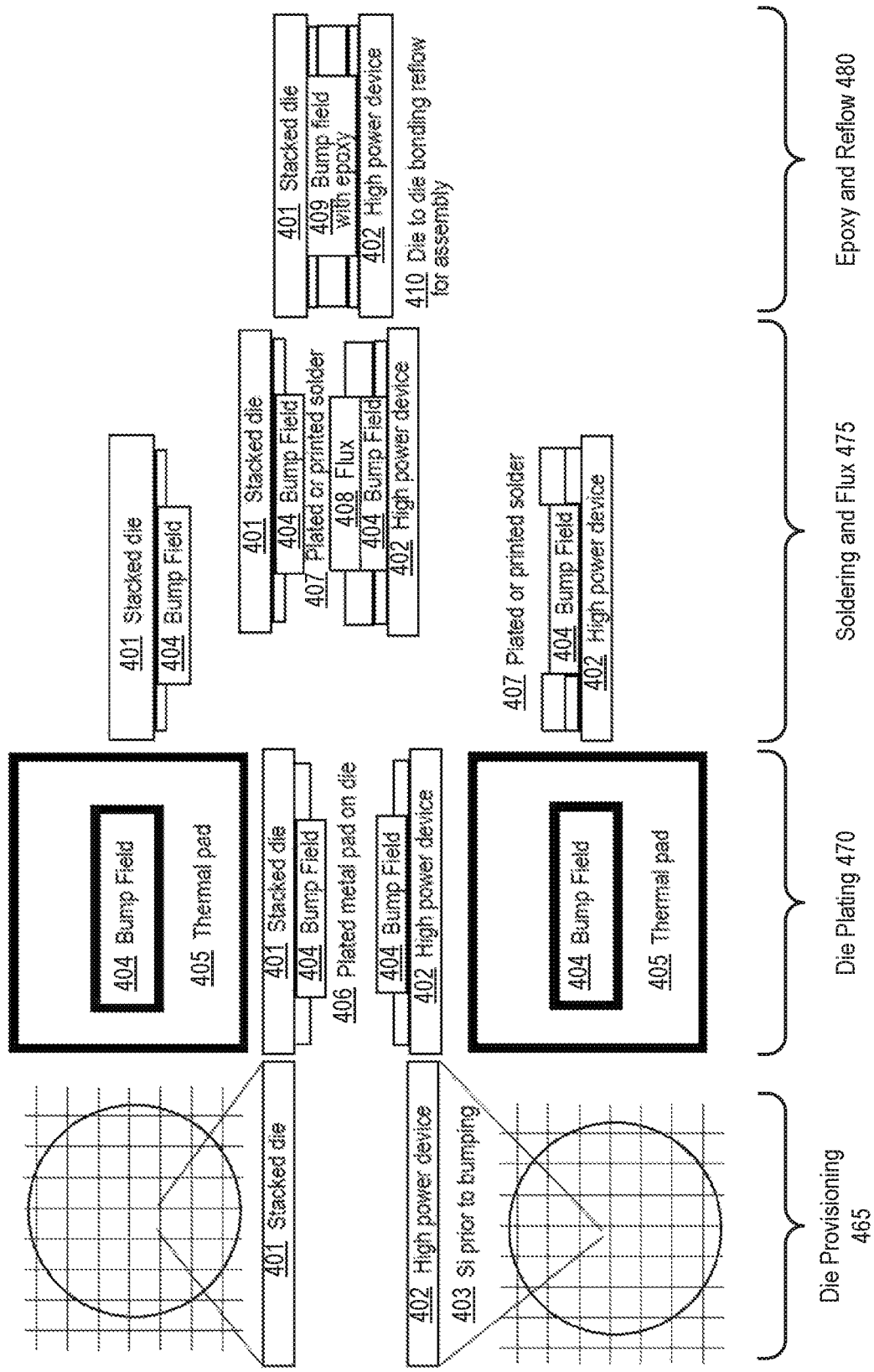
FIG. 4 depicts process flow details for the 3D package in accordance with the described embodiments.

FIG. 4 depicts process flow details for the 3D package in accordance with the described embodiments.

In particular, die provisioning at 465 depicts the provisioning of two or more functional silicon dies (e.g., such SoC logic Die 399 and memory die 320 depicted at FIG. 3) at the wafer level, each of the two or more functional silicon dies being assembled into a stacked configuration. As depicted at die provisioning 465, there is a top functional silicon die resulting in stacked die 401 and a bottom functional silicon die with high power device 402 resulting in the silicon die prior to bumping (element 403). By the end of die provisioning 465, both the top and the bottom dies are assembled into a stacked configuration.

At die plating 470, both the top and bottom dies (e.g., such SoC logic Die 399 and memory die 320 depicted at FIG. 3) are plated with solderable metal pads (element 406), such as Copper or Nickel metal pads. The solderable metal pads are plated outside of the bump field 404 area during the bumping process to create the thermal pad 405.

The bump field provides a series of solder joins or an area of solder joins which provides interconnects between the logic silicon die and the memory silicon die. The interconnects are within an epoxy material and a flux material within which the joins are formed, and as such, these structures are retained to provide the customary functionality.

However, the bump field need not be large. Therefore, in accordance with described embodiments, the bump field is a small area in the center of each of the respective dies, such as logic and memory dies or the stacked die 401 and the high power device 402 silicon die as is depicted here.

Conventional methodologies may apply the epoxy or flux material to the entire surface of each die in the creation of the bump field, however, as can be seen from the die plating 470 phase, there is a region for the bump field 404 in the center of each die and the remainder is allocated to the thermal pad 405 such that heat may conduct at a higher rate through the metallic structure of the solderable metal pads and solder rather than having to traverse an epoxy layer which is less conductive to heat.

Such a combination bump field 405 and thermal pad 405 allocation for the remainder of the respective silicon dies may be performed at silicon wafer fabrication in accordance with described embodiments.

In accordance with one embodiment, the die plating 470 process results in a thermal pad on the top side of the high power device 402 logic die and the bottom side of the stacked 401 memory die, such that the two interfaces or the two surfaces with the plating will meet once bonded. In between the two plated surfaces the solder will be applied thus bonding the top side of the high power device 402 logic die to the bottom side of the stacked 401 memory die.

This process therefore provides at least two significant improvements over conventional means. Firstly, there is a much larger area of contact through which to transfer heat from the buried high power device 402 deep within the 3D package. Secondly, the solderable metal pads and the solder bonding results in a much higher thermal conductor through the metallic structure materials as opposed to that which is feasible through the use of polymer.

At soldering and flux 475, solder is either plated or printed 407 on the solderable metal pad previously plated onto the respective dies at die plating operation 470. Flux 408 is then applied in a controlled manner only to the solder area or a prefluxed pre-form may be utilized for the flux area 408.

In accordance with one embodiment, the solderable metal pad is created during the silicon wafer fabrication process using copper filling on the top side of the logic device 199 and in a similar manner the memory die 120 is created during the silicon wafer fabrication process with copper filling on the bottom side of the memory die 120 resulting in there being two facing copper pads when the die stack is ready for assembly. One copper pad on the bottom of the memory die 120 and another copper pad on the top of the logic device 199.

For the soldering and flux 475, the solder may be preformed or a paste print of solder may then be added on top of the respective solderable metal thermal pads 405 and the epoxy material is dispensed or a film based epoxy material may be used in the locations of the bump field 404.

In accordance with one embodiment, thermal compression bonding is utilized to make the join for the soldering and flux 475 operation. In accordance with described embodiments, the bonding includes both the creation of the electrical joints that form the electrical interconnections within the bump field between the two functional silicon dies (e.g. the upper layer stacked die 401 and the lower layer high power device 402 logic die) and the bonding further includes the metallic interface connection via the soldering of the two metallic thermal pads 405, thus resulting in the assembled die stack.

At epoxy and reflow 480, epoxy or an epoxy flux film is applied or dispensed in the bump area on the bottom die and the top die (element 409) via die to die bonding reflow for assembly 410, thus bonding the top die to the bottom die through the bump field with the epoxy 409 to create an electrical connection through the bumps and a thermal heat path through the metal pads and solder.

Based on the physical properties of materials, the exemplary Cu (401 W/mK)/Ni (91 W/mK) pad and solder (60-80 W/mK) provides a significantly higher thermal conductivity as compared to any high K polymer based underfill (0.5-6 W/mK).

Heat transfer rate is directly proportional to the conduction area as dictated by Fourier's law of heat conduction and therefore, a full thermal pad provides a larger area for heat transfer as compared to multiple small thermal bumps. In addition, Solder Thermal Interface Material (STIM) is a proven material that has been used in thermal solutions for high power device packaging.

Figure 5:
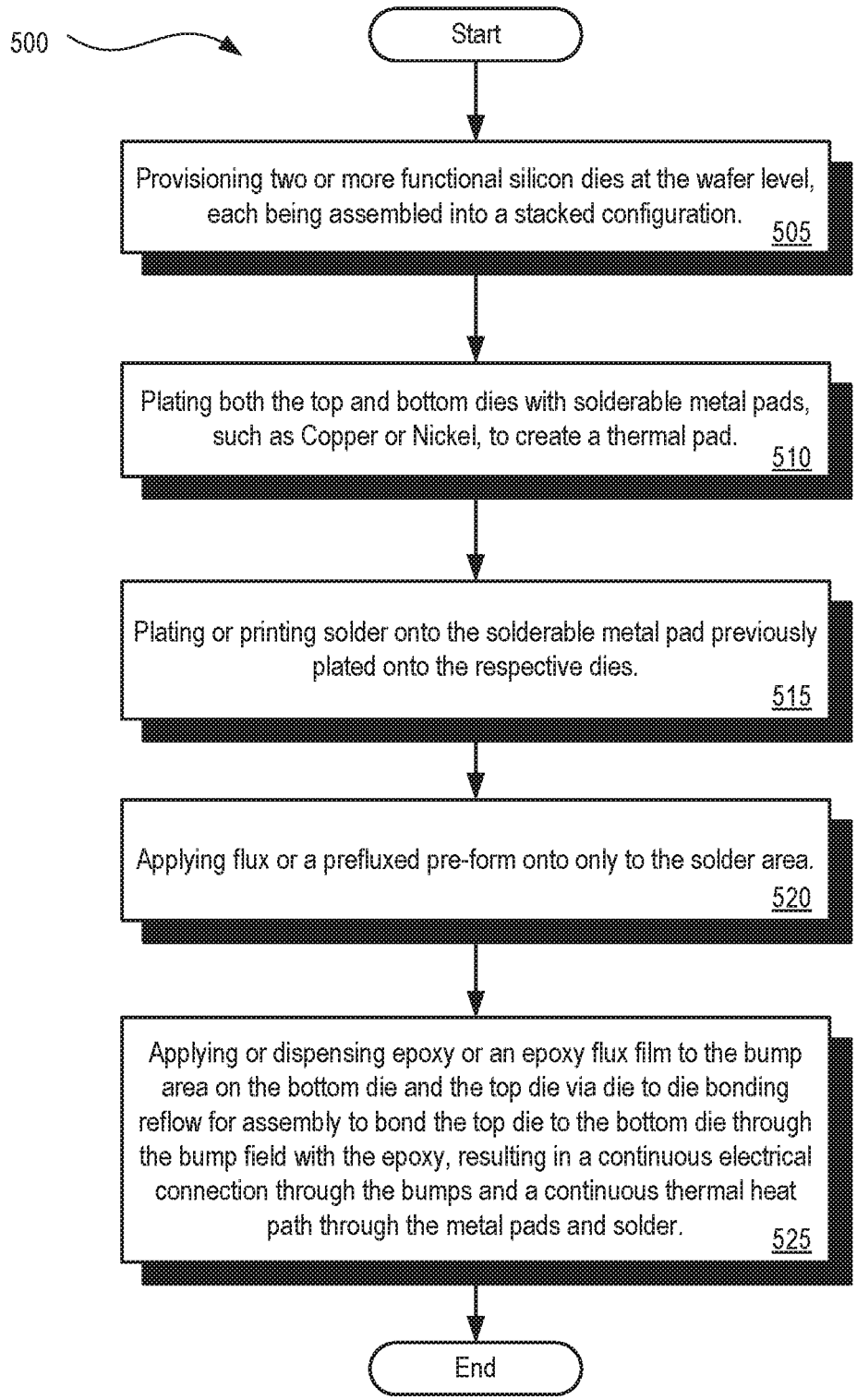
FIG. 5 is alternative view of the process flow details for the 3D package assembly as set forth by FIG. 4.

FIG. 5 is alternative view of the process flow details for the 3D package assembly as set forth by FIG. 4.

In particular, at block 505, the process flow 500 includes provisioning two or more functional silicon dies at the wafer level, each being assembled into a stacked configuration.

At block 510, the process flow 500 includes plating both the top and bottom dies with solderable metal pads, such as Copper or Nickel, to create a thermal pad.

At block 515, the process flow 500 includes plating or printing solder onto the solderable metal pad previously plated onto the respective dies.

At block 520, the process flow 500 includes applying flux or a prefluxed pre-form onto only to the solder area.

At block 525, the process flow 500 includes applying or dispensing epoxy or an epoxy flux film to the bump area on the bottom die and the top die via die to die bonding reflow for assembly to bond the top die to the bottom die through the bump field with the epoxy, resulting in a continuous electrical connection through the bumps and a continuous thermal heat path through the metal pads and solder.

Figure 6:
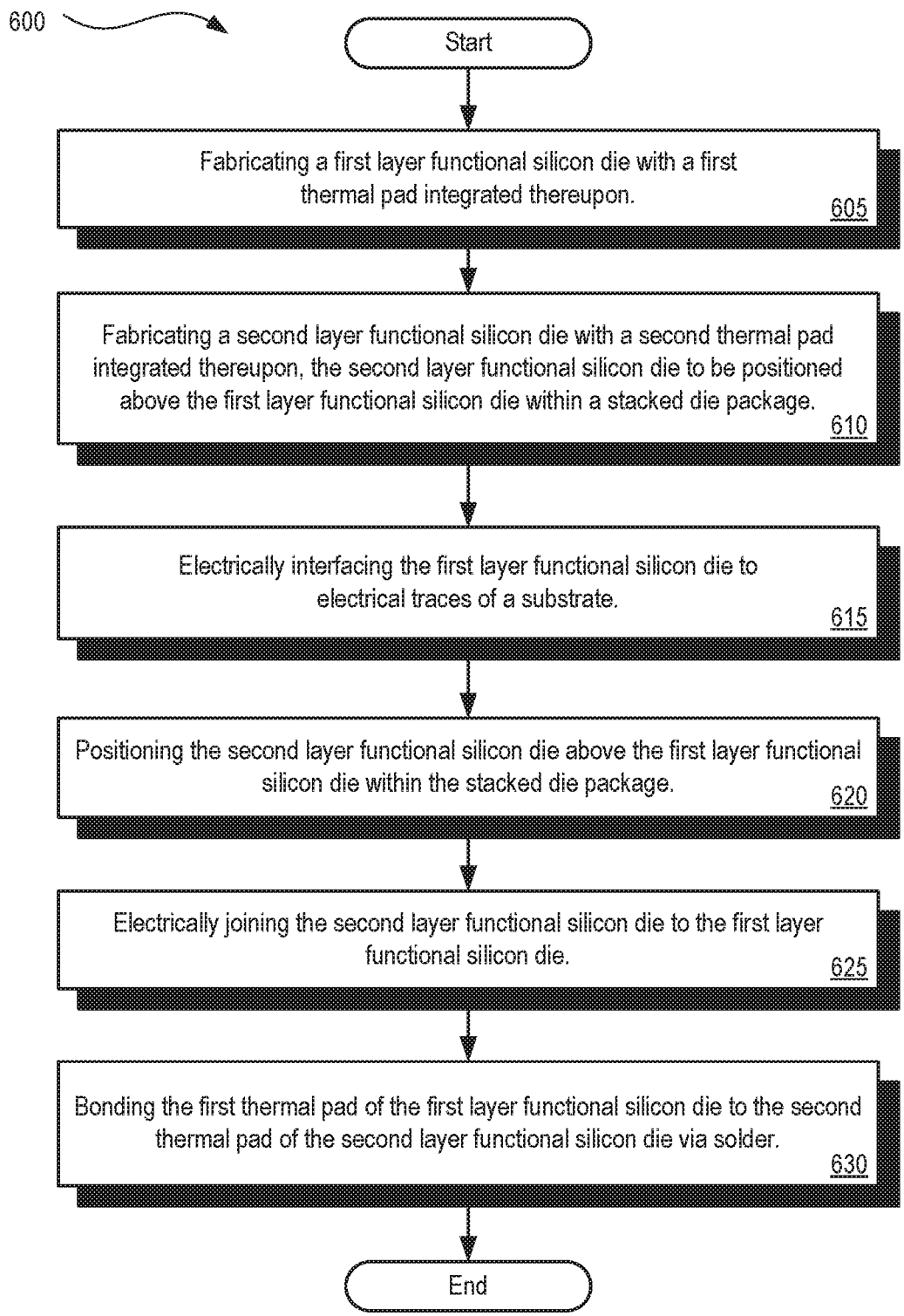
FIG. 6 is a flow diagram illustrating a method for implementing a thermal solution for 3D packaging in accordance with described embodiments.

FIG. 6 is a flow diagram illustrating a method 600 for implementing a thermal solution for 3D packaging in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 600 may be utilized in a variety of combinations.

At block 605 the method includes fabricating a first layer functional silicon die with a first thermal pad integrated thereupon;

At block 610 the method includes fabricating a second layer functional silicon die with a second thermal pad integrated thereupon, the second layer functional silicon die to be positioned above the first layer functional silicon die within a stacked die package.

At block 615 the method includes electrically interfacing the first layer functional silicon die to electrical traces of a substrate.

At block 620 the method includes positioning the second layer functional silicon die above the first layer functional silicon die within the stacked die package.

At block 625 the method includes electrically joining the second layer functional silicon die to the first layer functional silicon die.

At block 630 the method includes bonding the first thermal pad of the first layer functional silicon die to the second thermal pad of the second layer functional silicon die via solder.

In accordance with an embodiment of method 600, the first layer functional silicon die includes an electrically powered functional silicon die.

In accordance with an embodiment of method 600, the apparatus embodies a three-dimensional (3D) semiconductor package having the electrically powered functional silicon die buried internal to the 3D semiconductor package; in which the electrically powered functional silicon die generates heat which creates a hotspot within an interior core of the 3D semiconductor package; and in which the 3D semiconductor package dissipates the heat from the hotspot from the interior core of the 3D semiconductor package through the first thermal pad integrated upon the first layer functional silicon die and through the solder bonding the first thermal pad to the second thermal pad integrated upon the second layer functional silicon die and through the second thermal pad into the second layer functional silicon die positioned above the first layer functional silicon die and out a topmost surface of the 3D semiconductor package.

In accordance with an embodiment of method 600, an external heat sink is affixed to the topmost surface of the 3D semiconductor package; and in which the heat from the hotspot further dissipates from the topmost surface of the 3D semiconductor package and into the external heat sink.

In accordance with an embodiment, the method 600 further includes affixing an external heat sink to a topmost surface of the apparatus after manufacture of the apparatus or incorporating fittings to receive an external heat sink at the topmost surface of the apparatus after manufacture of the apparatus.

In accordance with an embodiment of method 600, the first layer functional silicon die includes a functional logic die; and in which the second layer functional silicon die includes a memory silicon die.

In accordance with an embodiment of method 600, the first thermal pad integrated upon the first layer functional silicon die is integrated with the first silicon die during a silicon wafer fabrication process of the first functional silicon die; and in which the second thermal pad integrated upon the second layer functional silicon die is integrated with the second silicon die during a silicon wafer fabrication process of the second functional silicon die.

In accordance with an embodiment of method 600, the apparatus embodies a stacked silicon die package; in which the first thermal pad integrated upon the first layer functional silicon die is metal plated upon the first silicon die during a stacked silicon die assembly process integrating the first and second functional silicon dies into the stacked silicon die package; and in which the second thermal pad integrated upon the second layer functional silicon die is metal plated upon the second silicon die during the stacked silicon die assembly process integrating the first and second functional silicon dies into the stacked silicon die package.

In accordance with an embodiment, the method 600 further includes positioning one or more spacers between the first thermal pad integrated upon the first layer functional silicon die and the second thermal pad integrated upon the second layer functional silicon die.

In accordance with an embodiment of method 600, the apparatus embodies a stacked silicon die package; in which the one or more spacers positioned between the first and second thermal pads are integrated within the stacked silicon die package during a stacked silicon die assembly process integrating the first and second functional silicon dies into the stacked silicon die package.

In accordance with such an embodiment, the method 600 further includes tuning a height of the solder for maximum thermal dissipation based on an optimal chip gap height attained between the first and second thermal pads integrated within the stacked silicon die package; and calibrating a height of the spacer to the optimal chip gap height between the first and second thermal pads integrated within the stacked silicon die package during the stacked silicon die assembly process.

In accordance with an embodiment of method 600, the apparatus embodies a three-dimensional (3D) substrate package or a stacked silicon die package; and in which the 3D substrate package or a stacked silicon die package is underfilled beneath the second layer functional silicon die positioned above the first layer functional silicon die fully encasing the first layer functional silicon die and at least partially encasing the second layer functional silicon die.

In accordance with an embodiment of method 600, the apparatus embodies a three-dimensional (3D) substrate package or a stacked silicon die package; and in which the 3D substrate package or a stacked silicon die package is molded within an encapsulation material fully encasing both the first layer functional silicon die and the second layer functional silicon die.

In accordance with an embodiment of method 600, the apparatus embodies a three-dimensional (3D) substrate package or a stacked silicon die package; and in which the apparatus is molded or underfilled via any one of: underfill material; molding compound, encapsulation material; non-thermally conductive polymer; highly thermally conductive polymer having thermally conductive fillers embedded therein; or an epoxy flux.

In accordance with an embodiment of method 600, the first and second thermal pads include one of nickel or copper solderable metal pads bonded to the first and second functional silicon dies respectively; and in which the solder includes either a dispensable or pre-formed thermally conductive metal alloy to bond the first and second thermal pads during a stacked silicon die assembly process integrating the first and second functional silicon dies into a stacked silicon die package.

In accordance with an embodiment of method 600, the second layer functional silicon die positioned above the first layer functional silicon die overhangs the first functional silicon die or is equal in width to the first functional silicon die.

According to a related embodiment, there is an apparatus which includes: a substrate layer having electrical traces therein; a first layer functional silicon die electrically interfaced to the electrical traces of the substrate layer, the first layer functional silicon die having a first thermal pad integrated thereupon; a second layer functional silicon die positioned above the first layer functional silicon die, the second layer functional silicon die having a second thermal pad integrated thereupon; and a conductivity layer positioned between the first layer functional silicon die and the second layer functional silicon die, in which the conductivity layer is to: (i) electrically join the second layer functional silicon die to the first layer functional silicon die and (ii) bond the first thermal pad of the first layer functional silicon die to the second thermal pad of the second layer functional silicon die via solder.

According to another related embodiment, there is a system which includes: a processor and a memory to execute instructions; a printed circuit board (PCB) motherboard having the processor and the memory mounted thereupon; and a 3D semiconductor package mounted to the PCB motherboard, the component package including: (i) a first layer functional silicon die electrically interfaced to the electrical traces of the substrate layer, the first layer functional silicon die having a first thermal pad integrated thereupon, (ii) a second layer functional silicon die positioned above the first layer functional silicon die, the second layer functional silicon die having a second thermal pad integrated thereupon, and (iii) a conductivity layer positioned between the first layer functional silicon die and the second layer functional silicon die, in which the conductivity layer is to: (a) electrically join the second layer functional silicon die to the first layer functional silicon die and (b) bond the first thermal pad of the first layer functional silicon die to the second thermal pad of the second layer functional silicon die via solder.

According to another embodiment, the system is embodied within one of: a smart phone; a tablet; a hand-held computing device; a personal computer; or a wearable technology to be worn as a clothing item or an accessory.

According to another embodiment of the system, the first layer functional silicon die includes an electrically powered functional silicon die; in which the second layer functional silicon die includes a memory; in which the electrically powered functional silicon die generates heat during operation of the system which creates a hotspot within an interior core of the 3D semiconductor package; and in which the 3D semiconductor package dissipates the heat from the hotspot from the interior core of the 3D semiconductor package through the first thermal pad integrated upon the first layer functional silicon die and through the solder bonding the first thermal pad to the second thermal pad integrated upon the second layer functional silicon die and through the second thermal pad into the second layer functional silicon die positioned above the first layer functional silicon die and out a topmost surface of the 3D semiconductor package.

Figure 7:
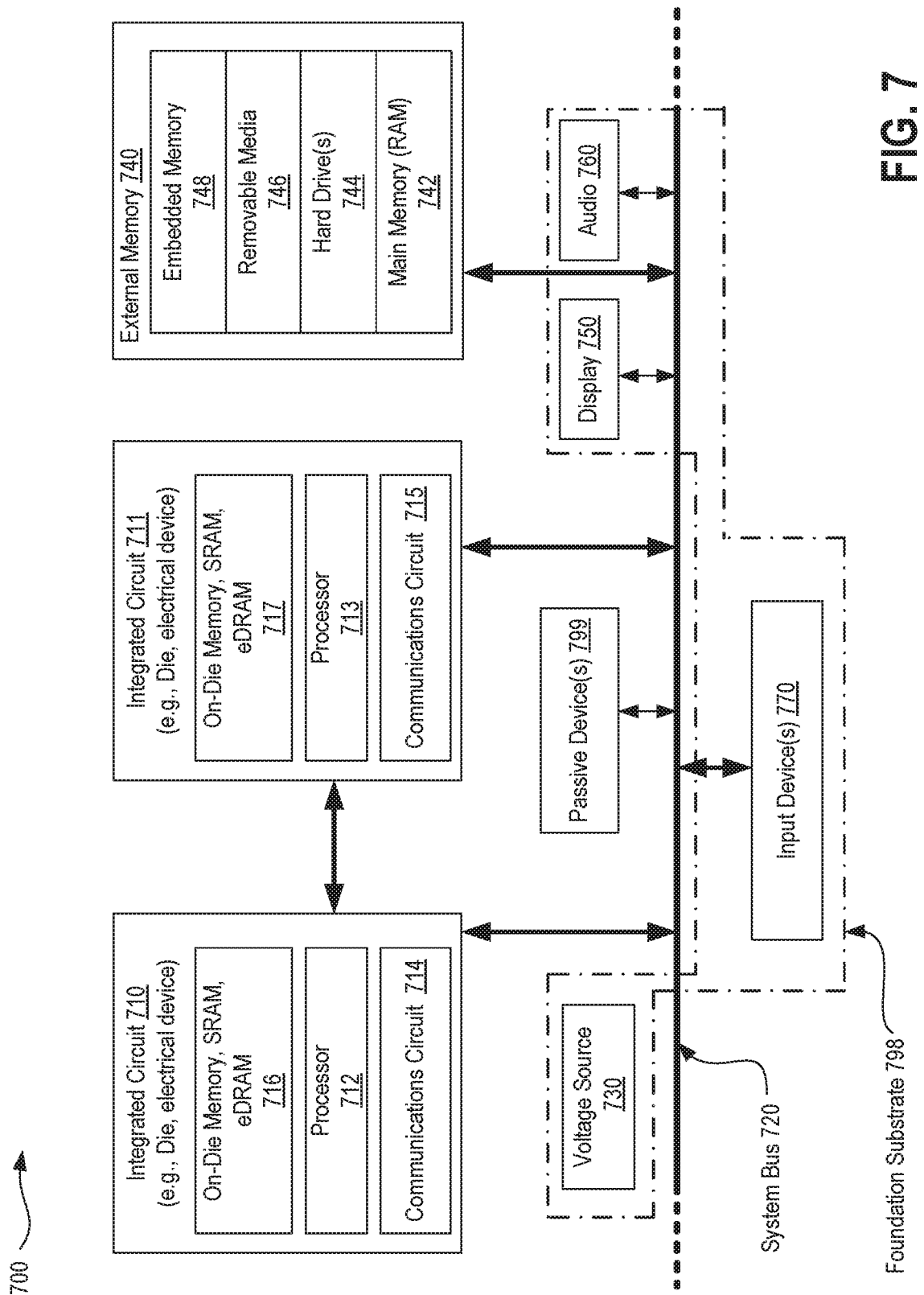
FIG. 7 is a schematic of a computer system, in accordance with described embodiments.

FIG. 7 is a schematic of a computer system 700, in accordance with described embodiments. The computer system 700 (also referred to as the electronic system 700) as depicted can embody a thermal solution for 3D packaging, according to any of the several disclosed embodiments and their equivalents as set forth in this disclosure. The computer system 700 may be a mobile device such as a net-book computer. The computer system 700 may be a mobile device such as a wireless smart phone or tablet. The computer system 700 may be a desktop computer. The computer system 700 may be a hand-held reader. The computer system 700 may be a server system. The computer system 700 may be a supercomputer or high-performance computing system.

In accordance with one embodiment, the electronic system 700 is a computer system that includes a system bus 720 to electrically couple the various components of the electronic system 700. The system bus 720 is a single bus or any combination of busses according to various embodiments. The electronic system 700 includes a voltage source 730 that provides power to the integrated circuit 710. In some embodiments, the voltage source 730 supplies current to the integrated circuit 710 through the system bus 720.

Such an integrated circuit 710 is electrically coupled to the system bus 720 and includes any circuit, or combination of circuits according to an embodiment. In an embodiment, the integrated circuit 710 includes a processor 712 that can be of any type. As used herein, the processor 712 may mean any type of circuit such as, but not limited to, a microprocessor, a microcontroller, a graphics processor, a digital signal processor, or another processor. In an embodiment, the processor 712 includes, or is coupled with, electrical devices having a thermal solution for 3D packaging, as disclosed herein.

In accordance with one embodiment, SRAM embodiments are found in memory caches of the processor. Other types of circuits that can be included in the integrated circuit 710 are a custom circuit or an application-specific integrated circuit (ASIC), such as a communications circuit 714 for use in wireless devices such as cellular telephones, smart phones, pagers, portable computers, two-way radios, and similar electronic systems, or a communications circuit for servers. In an embodiment, the integrated circuit 710 includes on-die memory 716 such as static random-access memory (SRAM). In an embodiment, the integrated circuit 710 includes embedded on-die memory 716 such as embedded dynamic random-access memory (eDRAM).

In accordance with one embodiment, the integrated circuit 710 is complemented with a subsequent integrated circuit 711. Useful embodiments include a dual processor 713 and a dual communications circuit 715 and dual on-die memory 717 such as SRAM. In accordance with one embodiment, the dual integrated circuit 710 includes embedded on-die memory 717 such as eDRAM.

In one embodiment, the electronic system 700 also includes an external memory 740 that in turn may include one or more memory elements suitable to the particular application, such as a main memory 742 in the form of RAM, one or more hard drives 744, and/or one or more drives that handle removable media 746, such as diskettes, compact disks (CDs), digital variable disks (DVDs), flash memory drives, and other removable media known in the art. The external memory 740 may also be embedded memory 748 such as the first die in a die stack, according to an embodiment.

In accordance with one embodiment, the electronic system 700 also includes a display device 750 and an audio output 760. In one embodiment, the electronic system 700 includes an input device 770 such as a controller that may be a keyboard, mouse, trackball, game controller, microphone, voice-recognition device, or any other input device that inputs information into the electronic system 700. In an embodiment, an input device 770 is a camera. In an embodiment, an input device 770 is a digital sound recorder. In an embodiment, an input device 770 is a camera and a digital sound recorder.

As shown herein, the integrated circuit 710 can be implemented in a number of different embodiments, including a package substrate having a thermal solution for 3D packaging, according to any of the several disclosed embodiments and their equivalents, an electronic system, a computer system, one or more methods of fabricating an integrated circuit, and one or more methods of fabricating an electronic assembly that includes a package substrate having a thermal solution for 3D packaging, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a thermal solution for 3D packaging embodiments and their equivalents. A foundation substrate 798 may be included, as represented by the dashed line of FIG. 7. Passive devices 799 may also be included, as is also depicted in FIG. 7.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is an apparatus to implement a thermal solution for 3D packaging, the apparatus comprising: a substrate layer having electrical traces therein; a first layer functional silicon die electrically interfaced to the electrical traces of the substrate layer, the first layer functional silicon die having a first thermal pad integrated thereupon; a second layer functional silicon die positioned above the first layer functional silicon die, the second layer functional silicon die having a second thermal pad integrated thereupon; and a conductivity layer positioned between the first layer functional silicon die and the second layer functional silicon die, wherein the conductivity layer is to: (i) electrically join the second layer functional silicon die to the first layer functional silicon die and (ii) bond the first thermal pad of the first layer functional silicon die to the second thermal pad of the second layer functional silicon die via solder.

According to one embodiment, the first layer functional silicon die comprises an electrically powered functional silicon die.

According to one embodiment, the apparatus embodies a three-dimensional (3D) semiconductor package having the electrically powered functional silicon die buried internal to the 3D semiconductor package; wherein the electrically powered functional silicon die generates heat which creates a hotspot within an interior core of the 3D semiconductor package; and wherein the 3D semiconductor package dissipates the heat from the hotspot from the interior core of the 3D semiconductor package through the first thermal pad integrated upon the first layer functional silicon die and through the solder bonding the first thermal pad to the second thermal pad integrated upon the second layer functional silicon die and through the second thermal pad into the second layer functional silicon die positioned above the first layer functional silicon die and out a topmost surface of the 3D semiconductor package.

According to one embodiment, an external heat sink is affixed to the topmost surface of the 3D semiconductor package; and wherein the heat from the hotspot further dissipates from the topmost surface of the 3D semiconductor package and into the external heat sink.

According to one embodiment the apparatus further includes: an external heat sink affixed to a topmost surface of the apparatus after manufacture of the apparatus or fittings to receive an external heat sink at the topmost surface of the apparatus after manufacture of the apparatus.

According to one embodiment, the first layer functional silicon die comprises a functional logic die; and wherein the second layer functional silicon die comprises a memory silicon die.

According to one embodiment, the first thermal pad integrated upon the first layer functional silicon die is integrated with the first silicon die during a silicon wafer fabrication process of the first functional silicon die; and wherein the second thermal pad integrated upon the second layer functional silicon die is integrated with the second silicon die during a silicon wafer fabrication process of the second functional silicon die.

According to one embodiment, the apparatus embodies a stacked silicon die package; wherein the first thermal pad integrated upon the first layer functional silicon die is metal plated upon the first silicon die during a stacked silicon die assembly process integrating the first and second functional silicon dies into the stacked silicon die package; and wherein the second thermal pad integrated upon the second layer functional silicon die is metal plated upon the second silicon die during the stacked silicon die assembly process integrating the first and second functional silicon dies into the stacked silicon die package.

According to one embodiment the apparatus further includes: one or more spacers positioned between the first thermal pad integrated upon the first layer functional silicon die and the second thermal pad integrated upon the second layer functional silicon die.

According to one embodiment, the apparatus embodies a stacked silicon die package; wherein the one or more spacers positioned between the first and second thermal pads are integrated within the stacked silicon die package during a stacked silicon die assembly process integrating the first and second functional silicon dies into the stacked silicon die package.

According to one embodiment, a height of the solder is tuned for maximum thermal dissipation based on an optimal chip gap height attained between the first and second thermal pads integrated within the stacked silicon die package; and wherein a height of the spacer is calibrated to the optimal chip gap height between the first and second thermal pads integrated within the stacked silicon die package during the stacked silicon die assembly process.

According to one embodiment, the apparatus embodies a three-dimensional (3D) substrate package or a stacked silicon die package; and wherein the 3D substrate package or a stacked silicon die package is underfilled beneath the second layer functional silicon die positioned above the first layer functional silicon die fully encasing the first layer functional silicon die and at least partially encasing the second layer functional silicon die.

According to one embodiment, the apparatus embodies a three-dimensional (3D) substrate package or a stacked silicon die package; and wherein the 3D substrate package or a stacked silicon die package is molded within an encapsulation material fully encasing both the first layer functional silicon die and the second layer functional silicon die.

According to one embodiment, the apparatus embodies a three-dimensional (3D) substrate package or a stacked silicon die package; and wherein the apparatus is molded or underfilled via any one of: underfill material; molding compound, encapsulation material; non-thermally conductive polymer; highly thermally conductive polymer having thermally conductive fillers embedded therein; or an epoxy flux.

According to one embodiment, the first and second thermal pads comprise one of nickel or copper solderable metal pads bonded to the first and second functional silicon dies respectively; and wherein the solder comprises either a dispensable or pre-formed thermally conductive metal alloy to bond the first and second thermal pads during a stacked silicon die assembly process integrating the first and second functional silicon dies into a stacked silicon die package.

According to one embodiment, the second layer functional silicon die positioned above the first layer functional silicon die overhangs the first functional silicon die or is equal in width to the first functional silicon die.

According to one embodiment there is a three-dimensional (3D) semiconductor package to implement a thermal solution for 3D packaging, the 3D semiconductor package comprising: a substrate layer having electrical traces therein; a first layer functional silicon die electrically interfaced to the electrical traces of the substrate layer; a second layer functional silicon die positioned above the first layer functional silicon die, the second layer functional silicon die partially covering a first portion of the first silicon functional die and wherein a second portion of the first silicon functional die remains uncovered by the second layer functional silicon die; a conductivity layer positioned between the first layer functional silicon die and the second layer functional silicon die, wherein the conductivity layer is to electrically join the second layer functional silicon die to the first layer functional silicon die; a thermal pad integrated upon a top surface of the first functional silicon die within the second portion of the first silicon functional die which remains uncovered by the second layer functional silicon die; encapsulation material fully encasing the first layer functional silicon die, the second layer functional silicon die, and the conductivity layer; a drill hole from which the a portion of the encapsulation material is evacuated from a surface of the 3D semiconductor package down to the thermal pad integrated upon the top surface of the first functional silicon die; and solder material partially filling the drill hole to bond a copper slug to the thermal pad within the drill hole.

According to one embodiment, the first layer functional silicon die comprises an electrically powered System On a Chip (SOC) logic device that generates heat during operation and creates a hotspot internal to the 3D semiconductor package.

According to one embodiment, the copper slug within the drill hole provides a continuous thermally conductive metallic interface to dissipate the heat from the hotspot internal to the 3D semiconductor package from the SOC logic device into the thermal pad through the solder material and into the copper slug; and wherein the copper slug reaches a top surface of the 3D semiconductor package from which the heat is dissipated from the 3D semiconductor package.

According to one embodiment, an external heat sink is affixed to the topmost surface of the 3D semiconductor package; and wherein the heat from the hotspot further dissipates from the copper slug reaching the topmost surface of the 3D semiconductor package and into the external heat sink.

According to one embodiment there is a method for implementing a thermal solution for 3D packaging, the method comprising: fabricating a first layer functional silicon die with a first thermal pad integrated thereupon;

fabricating a second layer functional silicon die with a second thermal pad integrated thereupon, the second layer functional silicon die to be positioned above the first layer functional silicon die within a stacked die package; electrically interfacing the first layer functional silicon die to electrical traces of a substrate; positioning the second layer functional silicon die above the first layer functional silicon die within the stacked die package; electrically joining the second layer functional silicon die to the first layer functional silicon die; and bonding the first thermal pad of the first layer functional silicon die to the second thermal pad of the second layer functional silicon die via solder.

According to one embodiment, the first thermal pad of the first layer functional silicon die is positioned at a top surface of the first layer functional silicon die; wherein the second thermal pad of the second layer functional silicon die is positioned at a bottom surface of the second layer functional silicon die and facing the first thermal pad of the first layer functional silicon die within the stacked die package; and wherein bonding the first thermal pad of the first layer functional silicon die to the second thermal pad of the second layer functional silicon die via solder comprises soldering the bottom surface of the second layer functional silicon die to the top surface of the first layer functional silicon die within the stacked die package via the first and second thermal pads.

According to one embodiment, the first layer functional silicon die comprises an electrically powered functional silicon die; wherein the second layer functional silicon die comprises a memory; wherein the electrically powered functional silicon die generates heat during operation which creates a hotspot within an interior core of the stacked die package; and wherein the stacked die package dissipates the heat from the hotspot from the interior core of the stacked die package through the first thermal pad integrated upon the first layer functional silicon die and through the solder bonding the first thermal pad to the second thermal pad integrated upon the second layer functional silicon die and through the second thermal pad into the second layer functional silicon die positioned above the first layer functional silicon die and out a topmost surface of the stacked die package.

According to one embodiment there is a system to implement a thermal solution for 3D packaging, the system comprising: a processor and a memory to execute instructions; a printed circuit board (PCB) motherboard having the processor and the memory mounted thereupon; and a 3D semiconductor package mounted to the PCB motherboard, the component package comprising: (i) a first layer functional silicon die electrically interfaced to the electrical traces of the substrate layer, the first layer functional silicon die having a first thermal pad integrated thereupon, (ii) a second layer functional silicon die positioned above the first layer functional silicon die, the second layer functional silicon die having a second thermal pad integrated thereupon, and (iii) a conductivity layer positioned between the first layer functional silicon die and the second layer functional silicon die, wherein the conductivity layer is to: (a) electrically join the second layer functional silicon die to the first layer functional silicon die and (b) bond the first thermal pad of the first layer functional silicon die to the second thermal pad of the second layer functional silicon die via solder.

According to one embodiment, the system is embodied within one of: a smart phone; a tablet; a hand-held computing device; a personal computer; or a wearable technology to be worn as a clothing item or an accessory.

According to one embodiment, the first layer functional silicon die comprises an electrically powered functional silicon die; wherein the second layer functional silicon die comprises a memory; wherein the electrically powered functional silicon die generates heat during operation of the system which creates a hotspot within an interior core of the 3D semiconductor package; and wherein the 3D semiconductor package dissipates the heat from the hotspot from the interior core of the 3D semiconductor package through the first thermal pad integrated upon the first layer functional silicon die and through the solder bonding the first thermal pad to the second thermal pad integrated upon the second layer functional silicon die and through the second thermal pad into the second layer functional silicon die positioned above the first layer functional silicon die and out a topmost surface of the 3D semiconductor package.

What is claimed is:

1. An apparatus to implement a thermal solution for 3D packaging, the apparatus comprising:
    a substrate layer having electrical traces therein;
    a first layer functional silicon die electrically interfaced to the electrical traces of the substrate layer, the first layer functional silicon die having a first thermal pad integrated thereupon;
    a second layer functional silicon die positioned above the first layer functional silicon die, the second layer functional silicon die having a second thermal pad integrated thereupon;
    one or more spacers positioned between the first thermal pad integrated upon the first layer functional silicon die and the second thermal pad integrated upon the second layer functional silicon die; and
    a conductivity layer positioned between the first layer functional silicon die and the second layer functional silicon die, wherein the conductivity layer is to:
        (i) electrically join the second layer functional silicon die to the first layer functional silicon die and (ii) bond the first thermal pad of the first layer functional silicon die to the second thermal pad of the second layer functional silicon die via solder.

2. The apparatus of claim 1, wherein the first layer functional silicon die comprises an electrically powered functional silicon die.

3. The apparatus of claim 2:
    wherein the apparatus embodies a three-dimensional (3D) semiconductor package having the electrically powered functional silicon die buried internal to the 3D semiconductor package;
    wherein the electrically powered functional silicon die generates heat which creates a hotspot within an interior core of the 3D semiconductor package; and
    wherein the 3D semiconductor package dissipates the heat from the hotspot from the interior core of the 3D semiconductor package through the first thermal pad integrated upon the first layer functional silicon die and through the solder bonding the first thermal pad to the second thermal pad integrated upon the second layer functional silicon die and through the second thermal pad into the second layer functional silicon die positioned above the first layer functional silicon die and out a topmost surface of the 3D semiconductor package.

4. The apparatus of claim 3: wherein an external heat sink is affixed to the topmost surface of the 3D semiconductor package; and wherein the heat from the hotspot further dissipates from the topmost surface of the 3D semiconductor package and into the external heat sink.

5. The apparatus of claim 1, further comprising:
an external heat sink affixed to a topmost surface of the apparatus after manufacture of the apparatus or fittings to receive an external heat sink at the topmost surface of the apparatus after manufacture of the apparatus.

6. The apparatus of claim 1:
wherein the first layer functional silicon die comprises a functional logic die; and
wherein the second layer functional silicon die comprises a memory silicon die.

7. The apparatus of claim 1:
wherein the first thermal pad integrated upon the first layer functional silicon die is integrated with the first silicon die during a silicon wafer fabrication process of the first functional silicon die; and
wherein the second thermal pad integrated upon the second layer functional silicon die is integrated with the second silicon die during a silicon wafer fabrication process of the second functional silicon die.

8. The apparatus of claim 1:
wherein the apparatus embodies a stacked silicon die package;
wherein the first thermal pad integrated upon the first layer functional silicon die is metal plated upon the first silicon die during a stacked silicon die assembly process integrating the first and second functional silicon dies into the stacked silicon die package; and wherein the second thermal pad integrated upon the second layer functional silicon die is metal plated upon the second silicon die during the stacked silicon die assembly process integrating the first and second functional silicon dies into the stacked silicon die package.

9. The apparatus of claim 1:
wherein the apparatus embodies a stacked silicon die package;
wherein the one or more spacers positioned between the first and second thermal pads are integrated within the stacked silicon die package during a stacked silicon die assembly process integrating the first and second functional silicon dies into the stacked silicon die package.

10. The apparatus of claim 1:
wherein a height of the solder is tuned for maximum thermal dissipation based on an optimal chip gap height attained between the first and second thermal pads integrated within the stacked silicon die package; and
wherein a height of the spacer is calibrated to the optimal chip gap height between the first and second thermal pads integrated within the stacked silicon die package during the stacked silicon die assembly process.

11. The apparatus of claim 1:
wherein the apparatus embodies a three-dimensional (3D) substrate package or a stacked silicon die package; and
wherein the 3D substrate package or a stacked silicon die package is underfilled beneath the second layer functional silicon die positioned above the first layer functional silicon die fully encasing the first layer functional silicon die and at least partially encasing the second layer functional silicon die.

12. The apparatus of claim 1:
wherein the apparatus embodies a three-dimensional (3D) substrate package or a stacked silicon die package; and
wherein the 3D substrate package or a stacked silicon die package is molded within an encapsulation material fully encasing both the first layer functional silicon die and the second layer functional silicon die.

13. The apparatus of claim 1:
wherein the apparatus embodies a three-dimensional (3D) substrate package or a stacked silicon die package; and
wherein the apparatus is molded or underfilled via any one of:
underfill material;
molding compound, encapsulation material;
non-thermally conductive polymer;
highly thermally conductive polymer having thermally conductive fillers embedded therein; or an epoxy flux.

14. The apparatus of claim 1:
wherein the first and second thermal pads comprise one of nickel or copper solderable metal pads bonded to the first and second functional silicon dies respectively; and
wherein the solder comprises either a dispensable or pre-formed thermally conductive metal alloy to bond the first and second thermal pads during a stacked silicon die assembly process integrating the first and second functional silicon dies into a stacked silicon die package.

15. The apparatus of claim 1:
wherein the second layer functional silicon die positioned above the first layer functional silicon die overhangs the first functional silicon die or is equal in width to the first functional silicon die.

16. A three-dimensional (3D) semiconductor package to implement a thermal solution for 3D packaging, the 3D semiconductor package comprising:
a substrate layer having electrical traces therein;
a first layer functional silicon die electrically interfaced to the electrical traces of the substrate layer;
a second layer functional silicon die positioned above the first layer functional silicon die, the second layer functional silicon die partially covering and extending beyond a first portion of the first silicon functional die wherein a second portion of the first silicon functional die remains uncovered by the second layer functional silicon die;
a conductivity layer positioned between the first layer functional silicon die and the second layer functional silicon die, wherein the conductivity layer is to electrically join the second layer functional silicon die to the first layer functional silicon die;
a thermal pad integrated upon a top surface of the first functional silicon die within the second portion of the first silicon functional die which remains uncovered by the second layer functional silicon die;
encapsulation material fully encasing the first layer functional silicon die, the second layer functional silicon die, and the conductivity layer; a drill hole from which the a portion of the encapsulation material is evacuated from a surface of the 3D semiconductor package down to the thermal pad integrated upon the top surface of the first functional silicon die; and
solder material partially filling the drill hole to bond a copper slug to the thermal pad within the drill hole.

17. The 3D semiconductor package of claim 16:
wherein the first layer functional silicon die comprises an electrically powered System On a Chip (SOC) logic device that generates heat during operation and creates a hotspot internal to the 3D semiconductor package.

18. The 3D semiconductor package of claim 17:
wherein the copper slug within the drill hole provides a continuous thermally conductive metallic interface to dissipate the heat from the hotspot internal to the 3D semiconductor package from the SOC logic device into the thermal pad through the solder material and into the copper slug; and wherein the copper slug reaches a top surface of the 3D semiconductor package from which the heat is dissipated from the 3D semiconductor package.

19. The 3D semiconductor package of claim 18:

wherein an external heat sink is affixed to the topmost surface of the 3D semiconductor package; and wherein the heat from the hotspot further dissipates from the copper slug reaching the topmost surface of the 3D semiconductor package and into the external heat sink.

20. A method for implementing a thermal solution for 3D packaging, the method comprising:

fabricating a first layer functional silicon die with a first thermal pad integrated thereupon;

fabricating a second layer functional silicon die with a second thermal pad integrated thereupon, the second layer functional silicon die to be positioned above the first layer functional silicon die within a stacked die package;

electrically interfacing the first layer functional silicon die to electrical traces of a substrate; positioning the second layer functional silicon die above the first layer functional silicon die within the stacked die package;

electrically joining the second layer functional silicon die to the first layer functional silicon die; and bonding the first thermal pad of the first layer functional silicon die to the second thermal pad of the second layer functional silicon die via solder, wherein one or more spacers are positioned between the first thermal pad integrated upon the first layer functional silicon die and the second thermal pad integrated upon the second layer functional silicon die.

21. The method of claim 20:

wherein the first thermal pad of the first layer functional silicon die is positioned at a top surface of the first layer functional silicon die;

wherein the second thermal pad of the second layer functional silicon die is positioned at a bottom surface of the second layer functional silicon die and facing the first thermal pad of the first layer functional silicon die within the stacked die package; and wherein bonding the first thermal pad of the first layer functional silicon die to the second thermal pad of the second layer functional silicon die via solder comprises soldering the bottom surface of the second layer functional silicon die to the top surface of the first layer functional silicon die within the stacked die package via the first and second thermal pads.

22. The method of claim 20:

wherein the first layer functional silicon die comprises an electrically powered functional silicon die; wherein the second layer functional silicon die comprises a memory;

wherein the electrically powered functional silicon die generates heat during operation which creates a hotspot within an interior core of the stacked die package; and wherein the stacked die package dissipates the heat from the hotspot from the interior core of the stacked die package through the first thermal pad integrated upon the first layer functional silicon die and through the solder bonding the first thermal pad to the second thermal pad integrated upon the second layer functional silicon die and through the second thermal pad into the second layer functional silicon die positioned above the first layer functional silicon die and out a topmost surface of the stacked die package.

23. A system to implement a thermal solution for 3D packaging, the system comprising:

a processor and a memory to execute instructions;

a printed circuit board (PCB) motherboard having the processor and the memory mounted thereupon; and a 3D semiconductor package mounted to the PCB motherboard, the component package comprising:

a first layer functional silicon die electrically interfaced to the electrical traces of the substrate layer, the first layer functional silicon die having a first thermal pad integrated thereupon, a second layer functional silicon die positioned above the first layer functional silicon die, the second layer functional silicon die having a second thermal pad integrated thereupon, one or more spacers positioned between the first thermal pad integrated upon the first layer functional silicon die and the second thermal pad integrated upon the second layer functional silicon die, and a conductivity layer positioned between the first layer functional silicon die and the second layer functional silicon die, wherein the conductivity layer is to:

(a) electrically join the second layer functional silicon die to the first layer functional silicon die and (b) bond the first thermal pad of the first layer functional silicon die to the second thermal pad of the second layer functional silicon die via solder.

24. The system of claim 23, wherein the system is embodied within one of:

a smart phone;

a tablet;

a hand-held computing device;

a personal computer; or a wearable technology to be worn as a clothing item or an accessory.

25. The system of claim 23:

wherein the first layer functional silicon die comprises an electrically powered functional silicon die;

wherein the second layer functional silicon die comprises a memory;

wherein the electrically powered functional silicon die generates heat during operation of the system which creates a hotspot within an interior core of the 3D semiconductor package; and wherein the 3D semiconductor package dissipates the heat from the hotspot from the interior core of the 3D semiconductor package through the first thermal pad integrated upon the first layer functional silicon die and through the solder bonding the first thermal pad to the second thermal pad integrated upon the second layer functional silicon die and through the second thermal pad into the second layer functional silicon die positioned above the first layer functional silicon die and out a topmost surface of the 3D semiconductor package.

* * * * *